United States Patent
Lo

(10) Patent No.: US 10,410,724 B2
(45) Date of Patent: Sep. 10, 2019

(54) ERASE PAGE INDICATOR

(71) Applicant: SK Hynix Inc., Gyeonggi-do (KR)

(72) Inventor: Yungcheng Thomas Lo, Cupertino, CA (US)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/421,112

(22) Filed: Jan. 31, 2017

(65) Prior Publication Data
US 2017/0293446 A1 Oct. 12, 2017

Related U.S. Application Data

(60) Provisional application No. 62/320,402, filed on Apr. 8, 2016.

(51) Int. Cl.
| G11C 16/04 | (2006.01) |
| G11C 16/10 | (2006.01) |
| G11C 16/16 | (2006.01) |
| G11C 7/10  | (2006.01) |
| G11C 16/26 | (2006.01) |
| G11C 16/34 | (2006.01) |

(52) U.S. Cl.
CPC .......... *G11C 16/0483* (2013.01); *G11C 7/106* (2013.01); *G11C 7/1063* (2013.01); *G11C 16/10* (2013.01); *G11C 16/16* (2013.01); *G11C 16/26* (2013.01); *G11C 16/349* (2013.01)

(58) Field of Classification Search
CPC .... G06F 3/0625; G06F 3/0659; G06F 3/0688; G11C 16/10; G11C 16/0483; G11C 16/16
See application file for complete search history.

(56) References Cited

U.S. PATENT DOCUMENTS

| 8,351,290 | B1 | 1/2013 | Huang et al. |
| 8,656,231 | B1 | 2/2014 | Huang et al. |
| 9,159,423 | B1 | 10/2015 | Brahmadathan et al. |
| 2001/0040824 | A1* | 11/2001 | Banks ................. G11C 11/5621 365/185.22 |
| 2009/0006929 | A1 | 1/2009 | Gorobets |
| 2014/0043897 | A1* | 2/2014 | Pan .................... G11C 11/5642 365/185.03 |
| 2015/0026540 | A1 | 1/2015 | Hsiao |
| 2017/0110197 | A1* | 4/2017 | Park ....................... G11C 16/28 |

* cited by examiner

*Primary Examiner* — Jerome Leboeuf

(74) *Attorney, Agent, or Firm* — Kilpatrick Townsend & Stockton LLP

(57) ABSTRACT

A flash memory device includes a flash memory comprising a plurality of pages for storing data, a control circuit configured to select a page of the plurality of pages in response to a received command, an accumulator configured to obtain a signal value of the selected page, and a comparator configured to compare the signal value with a predetermined value. The control circuit generates an indication signal indicative of a state of the selected page based on a comparison result.

16 Claims, 9 Drawing Sheets

ERASE PAGE INDICATOR

CROSS-REFERENCES TO RELATED APPLICATIONS

This application claims the benefit of priority under 35 U.S.C. § 119(e) to U.S. Provisional Application No. 62/320,402, filed Apr. 8, 2016, which is hereby incorporated by reference in its entirety and for all purposes.

FIELD OF THE INVENTION

The present invention relates generally to semiconductor devices. More particular, embodiments of the present invention relate to a flash memory having an erased page indicator.

BACKGROUND OF THE INVENTION

Non-volatile memory devices such as Solid State Drives (SSDs) are finding new applications in consumer electronics. For example, they are replacing Hard Disk Drives (HDDs), which typically comprise rapidly rotating disks (platters). Non-volatile memories, sometimes referred to as 'flash memories' (for example, NAND and NOR flash devices), are used in media storage, cameras, mobile phones, mobile computers, laptop computers, USB flash drives, etc. A non-volatile memory provides a relatively reliable, compact, cost-effective, and easily accessible means of storing data when its power supply is off.

Flash memory controllers are used to manage data stored in the non-volatile memory (e.g., flash memory), and to act as an interface between a host and the non-volatile memory. However, data transfer between a flash memory controller and a non-volatile flash memory consumes resources (bandwidth, power) and is time intensive. Conventionally, a flash memory transmits data of the requested page to a flash memory controller, which then determines whether the requested page contains valid data (i.e., the requested page is not an erased page) by counting the number of 1s or the number of 0xFF patterns. However, data transfer between a flash memory controller and a non-volatile flash memory consumes resources (bandwidth, power) and is time intensive.

Thus, there is a need to provide an improved way to reduce data traffic between a flash memory controller and a non-volatile flash memory.

BRIEF SUMMARY OF THE INVENTION

Embodiments of the present invention provides an efficient way of indicating whether a page in a flash memory is an erased page or an already written page.

In some embodiments, a flash memory device may include a flash memory having a plurality of pages for storing data, a control circuit configured to select a page of the plurality of pages in response to a received command, an accumulator configured to obtain a signal value of the selected page, and a comparator configured to compare the signal value with a predetermined value. The control circuit generates an indication signal indicative of a state of the selected page based on a comparison result.

In one embodiment, the signal value is a sum of voltage or current changes on bit lines of the flash memory.

In one embodiment, the accumulator includes a first operational amplifier coupled to the bit lines and configured to sum the voltage or current changes on the bit lines associated with the selected page.

In one embodiment, the comparator comprises a second operational amplifier having a first input terminal for receiving the signal value and a second terminal for receiving the predetermined value and an output terminal for outputting the comparison in response to the signal value and the predetermined value.

In one embodiment, the comparator includes an analog-digital converter configured to convert the signal value to a digital representation and a register configured to store the predetermined value. The comparator compares the digital representation with the predetermined value under control of the control circuit and outputs the comparison result. In one embodiment, the indication signal is a one-bit signal.

In one embodiment, the flash memory includes a NAND flash memory.

Embodiments of the present invention also provide a flash memory device containing a flash memory having a plurality of pages, each page of the plurality of pages is configured to store data. The flash memory device also includes a data register coupled to the flash memory and configured to latch data associated with a page of the plurality of pages, an input/output (I/O) interface configured to receive a command from a controller, and a control circuit. The control circuit is configured to select a page of the plurality of pages in response to a received command, obtain a signal value associated with data stored in the data register in response to the received command, compare the signal value with a predetermined value to obtain a comparison result, and generate an indication signal indicative of a state of the selected page based on the comparison result.

In one embodiment, the signal value is representative of a number of 1s or a number of 0xFF patterns in the data stored in the data register.

In one embodiment, the flash memory device may further include a decoder configured to decode the received command. The received command is associated with an operation to determine the state of the selected page and output the determined state of the selected page to the controller. In one embodiment, the controller is external to the flash memory.

In one embodiment, the flash memory comprises a NAND flash memory.

Embodiments of the present invention also provide a method of determining a state of a page in a flash memory comprising a plurality of pages and a control circuit. The method may include selecting a page from the plurality of pages based on a command received from a controller coupled to the flash memory, obtaining a signal value associated with the selected page in response to the received command, comparing the signal value with a threshold value, and outputting an indication signal indicative of the state of the selected page based on a comparison result.

In one embodiment, the indication signal is a one-bit signal.

In one embodiment, the signal value is a sum of signal changes on hit lines associated with the selected page.

In one embodiment, the method may further include storing data of the selected page into a register. The signal value is representative of a number of 1s or a number of 0xFF patterns of the data stored in the register.

In one embodiment, the method may further include, upon determining that the number of 1s or the number of 0xFF patterns is greater than the threshold value, determining that the selected page is an erased page, otherwise determining that the selected memory page is a programmed page.

In one embodiment, the method may further include storing an address associated with the erased page, and transmitting the address to the controller.

The following description, together with the accompanying drawings, will provide a better understanding of the nature and advantages of the claimed invention.

DETAILED DESCRIPTION OF THE INVENTION

Figure 1A:
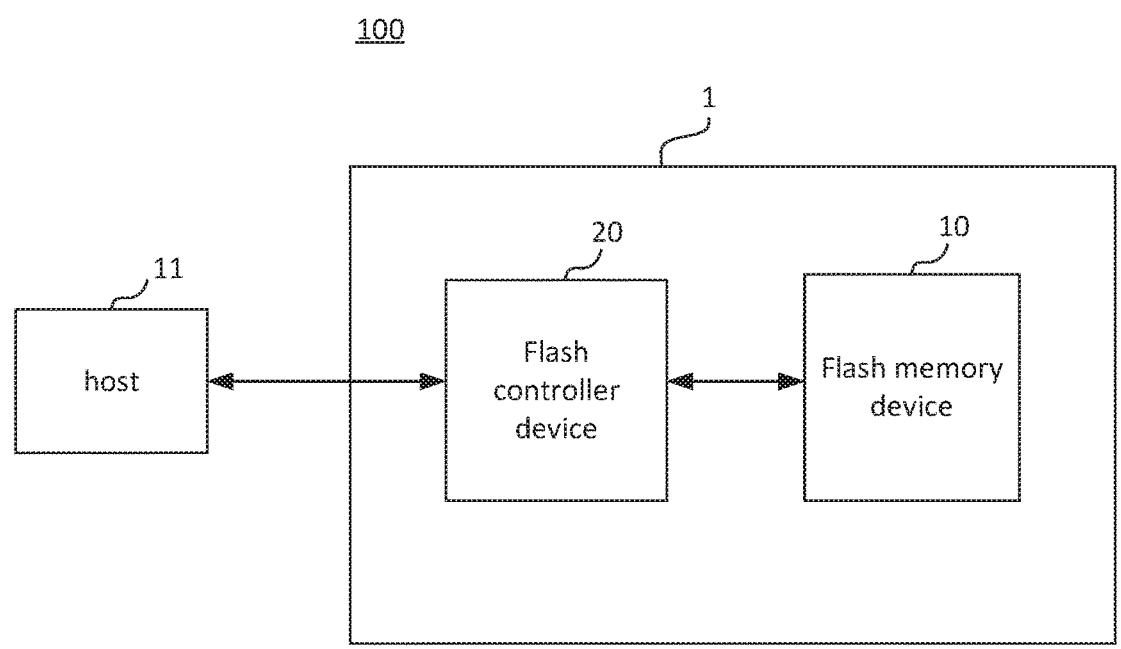
FIG. 1A is a simplified block diagram illustrating a system including a host and a storage device architecture according to some embodiments of the present disclosure.

In the following description, numerous specific details are provided a thorough understanding of the present invention. However, it should be appreciated by those of skill in the art that the present invention may be realized without one or more of these details. In other examples, features and techniques known in the art will not be described for purposes of brevity.

It will be understood that the drawings are not drawn to scale, and similar reference numbers are used for representing similar elements. Embodiments of the invention are described herein with reference to functional block diagrams that are schematic illustrations of idealized embodiments (and intermediate structures) of the invention.

It will be understood that, when an element or component is referred to as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

Currently, an erased page of a flash memory is determined by a controller device that is external to the flash memory. In several implementations, an erased page stored on the flash memory is indicated by data that is all or mostly is in the page. For example, a controller needs to know whether a page in the flash memory is an erased page before writing data into it. The controller will send a read command to the flash memory, which upon receiving the read command, sends data of a selected page to the controller that then determines whether or not selected page is erased by counting the number of 1s or the number of 0xFF patterns. Data transfer of an erased page through the channel between the controller and the flash memory consumes resources (bandwidth, power) and is thus not efficient.

The conventional mechanism of an erased page search impacts the system performance, especially on a Last Written Page (LWP) search operation. Instead of transferring a whole page of data on the requested page address from the flash memory, an erased page indicator can be generated and used to improve the conventional counting mechanism in the controller. In accordance with the present invention, the operations can be implemented in the flash memory to determine whether a requested page is an erased page and send a message to the controller to indicating that the page is an erased page.

In accordance with the present invention, the channel bandwidth between the controller and the flash memory can be optimally used (e.g., the whole page of data in 4 Kbytes vs an indicator signal of less than one byte), thus, the system performance is significantly improved.

In some implementations, the flash memory device may be made up of NAND flash cells. An SLC (single level cell) NAND cell can support one bit per cell, and an MLC (multi-level cell) NAND cell can support two or more bits per cell. Single NAND flash cells that individually store a single bit of 0 or 1 can be joined together in strings and arrays to form much larger data storage structures. These strings can be connected to allow storage and retrieval of data from selected cells. A row of NAND cells can make up a word-line (WL) and is generally the smallest unit to program. A page generally shares the same word-line and can comprise thousands of NAND flash cells. For example, typical page sizes can include 16 Kbytes, 32 Kbytes, 64 Kbytes or 128 Kbytes NAND cells. A block can include a two-dimensional array comprising pages rows and strings (columns). For example, block sizes of 8 Mbytes are known.

In general, multiple operations of a flash memory are performed in the flash memory controller, e.g., counting, calculating, error detecting, error correcting, etc. However, transferring data between the flash memory controller and the flash memory consumes time and power due to the limited interconnect bandwidth and voltage swings. Thus, an efficient use of the scarce interconnect bandwidth between the flash memory controller and the flash memory is very critical. Instead of relying on the controller to perform simple operations, such as counting, some operations can be performed by the flash memory. The present invention is to move operations such as determining an erased page from the flash memory controller to the flash memory. The data transfer required between the controller and the flash memory in order for the controller to determined whether the page is an erased page can be reduced to sending an erased page indicator signal.

Replacing the conventional mechanism of transferring a whole page of data to sending an erased page indicator signal significantly reduces the interconnect bandwidth utilization, thereby significantly improving the system performance. In accordance with the present invention, the interconnect bandwidth can be utilized more efficiently because the flash memory determines whether or not the requested page is an erased page.

FIG. 1A is a simplified block diagram illustrating a system 100 including a host 11 coupled to a storage device 1. Storage device 1 may include a flash memory controller 20 coupled to a flash memory device 10. In conventional operating systems, the flash memory controller which is external to the flash memory device is used to determine whether a page is erased by counting the number of 1s or the number of 0xFF of data readout of the page. For example, software or hardware in the flash memory controller will perform the counting to determine whether the page is an erased page. When the flash memory controller determines that the page is not an erased page, it will send request to the flash memory to read out data of a next page until an erased page is found. This process of determining the address of the last written page is power and time consuming and consumes valuable channel bandwidth between the flash memory controller and the flash memory.

Figure 1B:
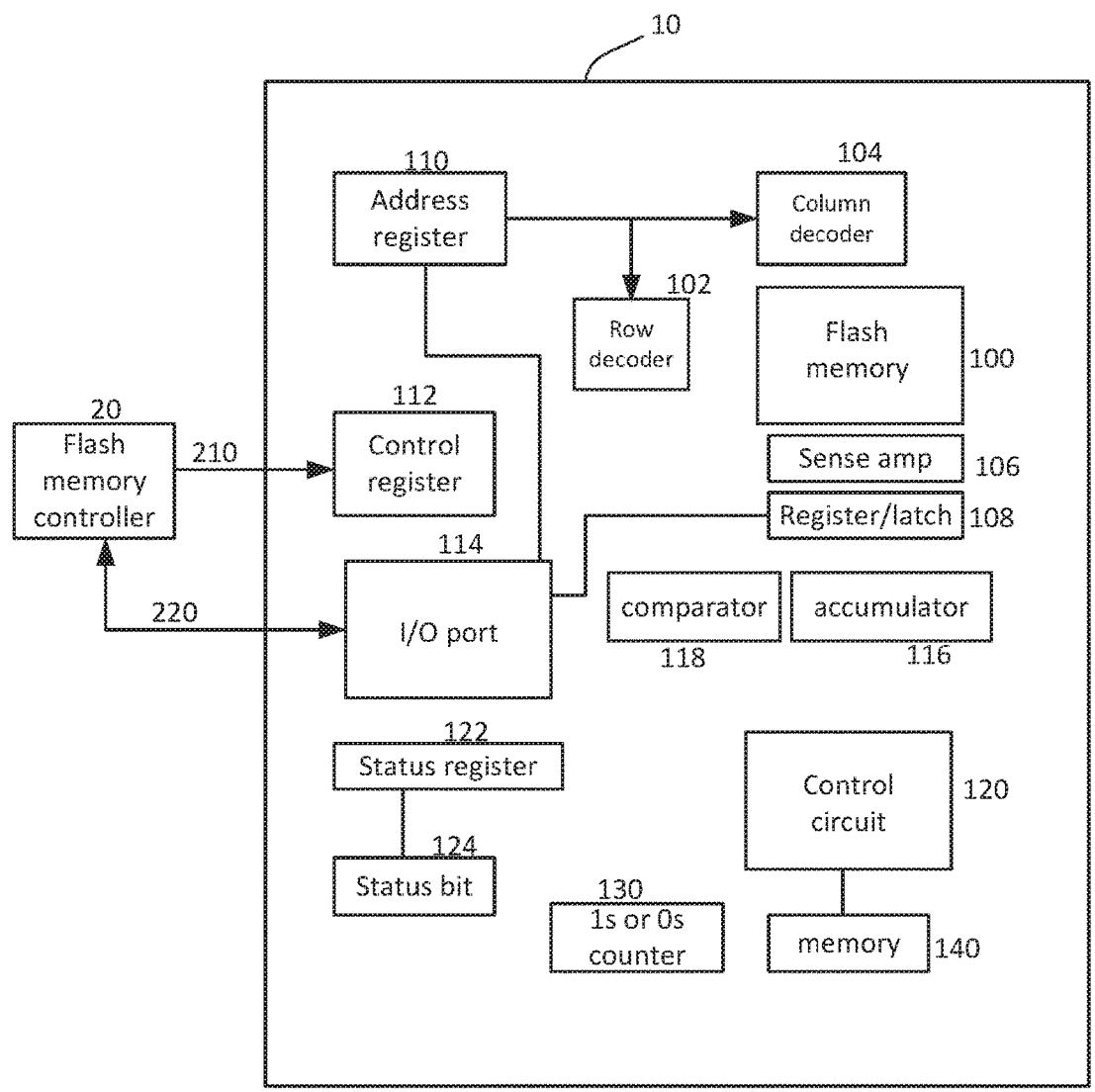
FIG. 1B is a block diagram illustrating a storage device architecture according to some embodiments of the present disclosure.

FIG. 1B is a functional block diagram illustrating a storage device 1 including a flash memory controller 20 in communication with a flash memory device 10 according to some embodiments of the present invention. In some examples, flash memory controller 20 can be external to flash memory device 10. In some such examples, flash memory controller 20 can interact with a plurality of flash memory devices. In some embodiments, other non-volatile memory can be used in place of or in addition to flash memory device 10. Examples can include read only memory (ROM), a mask ROM (MROM), a programmable ROM (PROM), an erasable programmable ROM (EPROM), an electrically erasable programmable ROM (EEPROM), ferroelectric RAM (F-RAM), magnetoresistive RAM (MRAM), polymer-based organic memory, holographic memory, phase change memory and the like. In some embodiments, system 1 may be an SSD device including flash memory controller 20 and one or more flash memories 10. In other embodiments, flash memory controller 20 may be integrated into flash memory 10 to form a flash memory device.

In some embodiments, flash memory device 10 may include a flash memory 100, a row decoder 102, a column decoder 104, a sense amplifier 106, a register (latch) 108, and an address register 110. In some implementations, flash memory 100 may be made of NAND flash cells. An SLC (single level cell) NAND cell can support one bit per cell, and an MLC (multi-level cell) NAND cell can support two or more bits per cell. Single NAND flash cells that individually store a single bit of 0 or 1 can be joined together in strings and arrays to form much larger data storage structures. These strings can be connected to allow storage and retrieval of data from selected cells. A row of NAND cells can make up a word-line (WL) and is generally the smallest unit to program. A page generally shares the same word-line and can comprise thousands of NAND flash cells. For example, typical page sizes can include 16K, 32K, 64K or 128K NAND cells. Flash memory 100 may include a plurality of blocks, each block includes a plurality of pages. Each page may include a plurality of bit lines and shares a word line. Sense amplifier circuit 106 is connected to each bit line of a page that shares a selected word line. Register (latch) 108 has a set of latches having the size of the selected page to store (latch) data of the selected page. Flash memory 10 may also include a control register 112 and an Input/Output (I/O) port 114. Control register 112 is coupled to flash memory controller 20 that may be external to flash memory 10. Control register 112 is configured to receive commands (e.g., CE, CLE, ALE, WE, RE, WP, etc.) from flash memory controller 20 via a command connection 210. For example, command CE (chip enable) selects flash memory device 10; command CLE (chip latch enable) is to control loading of a command from the flash memory controller to the flash memory; command ALE (address latch enable) is to latch the address to the address register; command WE (write enable) is to acquire data from the I/O port; RE (read enable) is to read data out from the register; WP (write program) is to write data to the flash memory. The I/O port is configured to transfer address, data to and from the external controller through a bidirectional connection 220. One of skill in the art will appreciated that connections 210 and 220 may be logical representations of connections on the same physical bus or connection. For example, the physical connection bus may include a number of physical connection lines that are used to transmit data, addresses, commands. The connection bus may include a source synchronous connection or a clock-recovered asynchronous connection.

In some embodiments, flash memory device 10 may further include an accumulator 116, a comparator 118, a control circuit 120, and a status register 122. In some embodiments, accumulator 116 may include an analog circuit coupled to a selected page of the flash memory and configured to sum voltages or currents (or their changes) associated with the selected page under control signals issued by the control circuit. For example, the analog accumulator may be coupled to bit lines for accumulating signals or signal changes on the bit lines. In some embodiments, accumulator 116 may include a digital circuit coupled to register 108 and configured to add the number of bits in register 108. For example, the digital accumulator may be coupled to register 108 for adding the number of 0xFF patterns in register 108. Comparator 118 is coupled to the accumulator. In some embodiments, when the accumulator is an analog circuit, comparator 118 is an analog comparator configured to determine whether the summed signal level of the accumulator is above, below or within a predetermined value or value range. In some embodiments, when the accumulator is a digital circuit, comparator 118 may be a digital comparator configured to determine whether the number of 0xFF patterns in register 108 is greater than a predetermined digital value. Control circuit 120 may be the central processing unit configured to control the entire flash memory during various operating modes. Control circuit 120 may include one or more processing units and memory containing program code and instructions for performing read and write and last written page search operations. The function of the accumulator, comparator, control circuit and status register will be described further in detail below. In some embodiments, flash memory 10 may not have an accumulator for summing up voltage or current associated with a page. In such cases, the determination whether a selected page is an erased page will be determined by the total number of 1s or 0s in register 108, and the total number of 1s or 0s in the register is compared with a digital value or value range. In some embodiments, a 1s or 0s counter 130 may be used to count the number of 1s or 0s in register 108. In other embodiments, the counting and comparing operations can be performed by control circuit 120.

Figure 2:
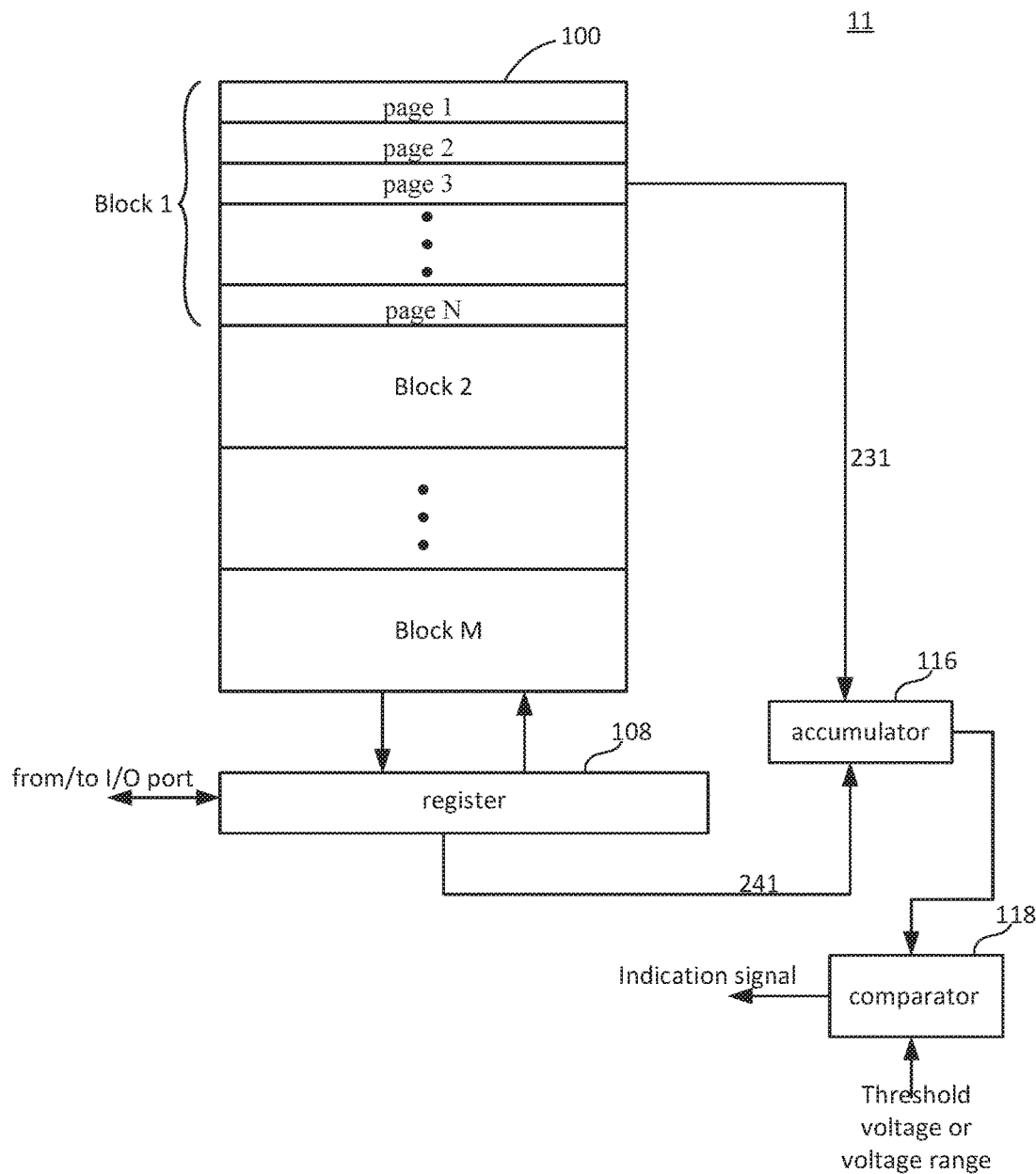
FIG. 2 is a schematic circuit diagram of a portion of the storage device that is applicable to embodiments of the present disclosure.

FIG. 2 is a schematic block diagram illustrating a portion 11 of flash memory device 10 according to an embodiment of the present invention. As shown in FIG. 2, portion 11 of the flash memory device includes a flash memory (e.g., flash memory 100) comprising a number M of blocks (block 1, . . . , block M), and each block contains a number N of pages (page 1, page 2, . . . , page N). A page may contain a multiple of 512 bytes, e.g., 512 bytes, 1,024 bytes ((1 Kbytes), 2 Kbytes, 16 Kbytes, etc. During a read operation, data of a selected page is sensed by the sense amplifier and latched into register 108. In certain embodiments, the size of register 108 matches the page size. Thereafter, the data stored in the register may be sequentially sent through the I/O port to flash memory controller 20.

There are typically three operations in a flash memory: read a page, program a page, and erase a block. That is, read and program operations take place on a page granularity. The erase operation takes place on a block granularity. In a page program operation, a page of data is written into data register 108 and then programmed into the flash memory. In a block erase operation, a group of consecutive pages is erased in a single operation.

At power-up, a flash memory controller device does not have information about which page(s) of the flash memory contains written data and which page(s) have been erased. Since a page cannot be written again as it had been written, the flash memory controller must find out whether or not a page of the associated block has been erased. In order to determine that a page has been erased, the flash memory controller has to read data of the selected page. Since data in the selected page is read out sequentially through the I/O port, reading out of data in order for the flash memory controller to determine whether the selected page is an erased page or a programmed (written) page is time intensive and consumes bandwidth between the external controller and the flash memory in conventional techniques. Furthermore, data transmitting through the I/O port increases power consumption of the system, as known in the prior art.

According to some embodiments of the present invention, determining a selected page as being an erased page is performed by the flash memory (e.g., flash memory device 10) itself. For example, flash memory device 10 receives a command from flash memory controller 20 to read data from a selected page. After decoding the command, flash memory device 10 performs a read operation of the selected page. In certain embodiments, the flash memory device 10 may use digital and/or analog circuitry to determine if the page is an erased page or a programmed page. In certain implementations, an erased page comprises data that is all 1's or has 1's above a threshold. Therefore, in certain embodiments, flash memory device 10 may include digital and/or analog circuitry to determine if the data in the page accessed has all 1's to determine if the page is an erased page. In certain other implementations, an erased page may comprise other sets of data that might be indicative of an erased page. For example, in another implementation, an erased page may be all 0's or may have a pre-determined or derived pattern. In some embodiments, reading the selected page includes sensing a voltage or current change of a number of bit lines corresponding to the selected page. Sensing the state of a selected cell may include applying a voltage to a selected word line, the bit line corresponding to the selected bit cell is sensed to determine whether or not a current flows through the selected bit cell. In an exemplary embodiment, the amount of current flowing through the selected bit cell determines the logic state of the bit cell.

In an embodiment of the present invention, the current change that is sensed on each bit line associated with a selected page is accumulated in a current accumulator. If the amount of the accumulated current level of all bit lines in a selected page is higher than a predetermined value, the selected page is determined to be an erased page. Conversely, if the amount of the accumulated (summed) current level of all bit lines in a selected page is lower than the predetermined value, the selected page is determined to be not an erased page, i.e., it is determined to be a programmed page (i.e., a page containing written data).

In another embodiment of the present invention, the voltage change that is sensed on each bit line associated with a selected page is accumulated in a voltage accumulator. If the amount of the accumulated (summed) voltage level of all bit lines in a selected page is higher than a predetermined value, the selected page is determined to be an erased page. Conversely, if the amount of the accumulated voltage of all bit lines in a selected page is lower than a predetermined value, the selected page is determined to be not an erased page, i.e., it is determined to be a programmed page.

As described above and shown in FIG. 2, the state (erased or programmed) of a selected page may be determined using either analog circuitry, digital circuitry, or a combination of analog and digital circuitries. For example, connection 231 denotes signals changes on bit lines that can be accumulated in an analog accumulator, and connection 241 denotes the number of 1s or the number of 0xFF patterns in register 108 that can be added in a digital accumulator and counted by counter 130.

Figure 3A:
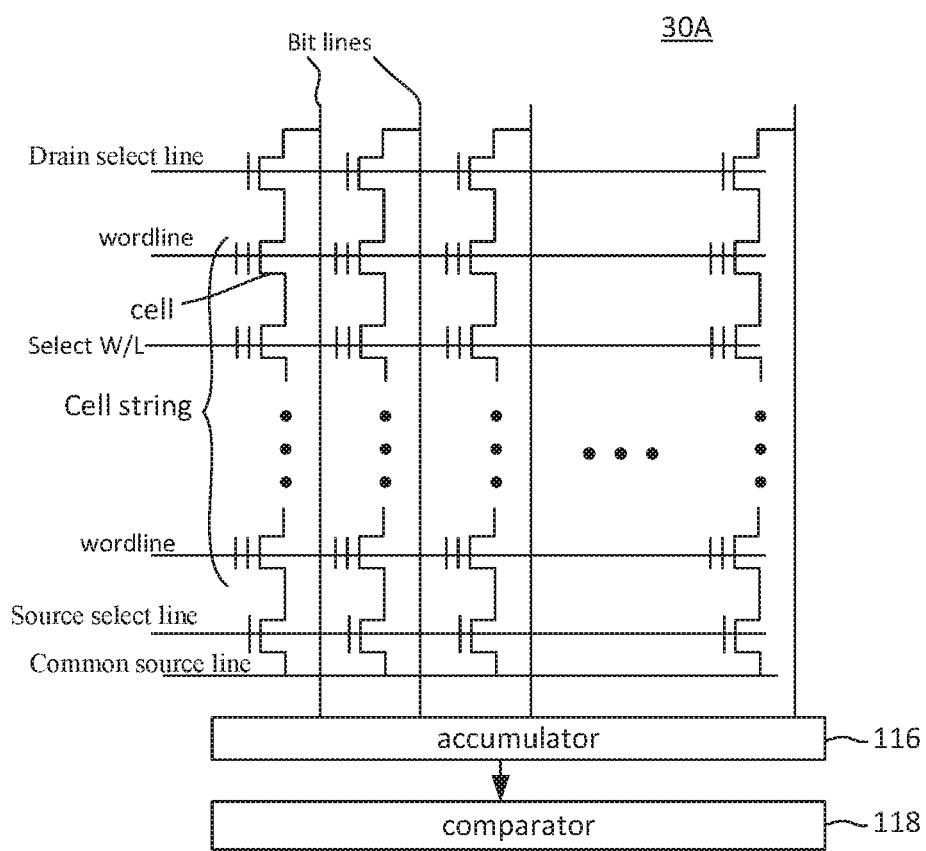
FIG. 3A is a schematic diagram illustrating a portion of a flash memory according to embodiments of the present disclosure.

FIG. 3A is a schematic diagram illustrating a block 30A of a flash memory structure according to some embodiments of the present disclosure. Referring to FIG. 3A, block 30A includes a plurality of memory cell strings, each cell string is connected to a bit line and includes a plurality of series-connected memory cells. Each memory cell may have an n-channel MOSFET structure including a floating gate as a charge accumulation layer and a control gate. Adjacent memory cells share the drain or source. The control gates of memory cells of the same row are connected to a word line. A group of memory cell strings which share the word lines forms a block. In an erase operation, all memory cells in the block are erased. In the read and write operations, a drain select transistor is turned on to connect a series-connected memory-cell string to a bit line. A selection voltage is applied to a word line, and a non-selection voltage is applied to the remaining word lines on the same memory cell string. The bit lines are connected to accumulator 116 which is configured to accumulate (sum) the current or voltage changes of the bit lines. Accumulator 116 then provides the amount of accumulated (summed) current or voltage level to a comparator 118 to compare with a predetermined current or voltage value.

Each memory cell may store one or more bits of data. Memory cells that store one bit of data are referred to as single-level cells, and memory cells that store more bits of data are referred to as multi-level cells. Single-level cells are used in the following description to explain embodiments of the present invention. However, the present disclosure is not limited thereto. As appreciated by those of skill in the art, the teachings herein are also applicable to multi-level cells as well.

To perform a program operation, flash memory controller 20 transmits a program command, the data to be programmed and the physical address to the page to the flash memory. A row of the memory cell array corresponding to the requested page is selected. A memory cell is a MOS transistor having a floating gate for storing data in the form of electrical charge. For writing a logic "0" to a selected cell, bit line connected to the drain of the access transistor of the string is grounded, a voltage pulse is applied to the gate of the selected cell. For reading data from a selected cell, the bit line associated with the memory cell string is precharged to a certain voltage level, a voltage pulse is applied to the word line of the selected cell.

Figure 3B:
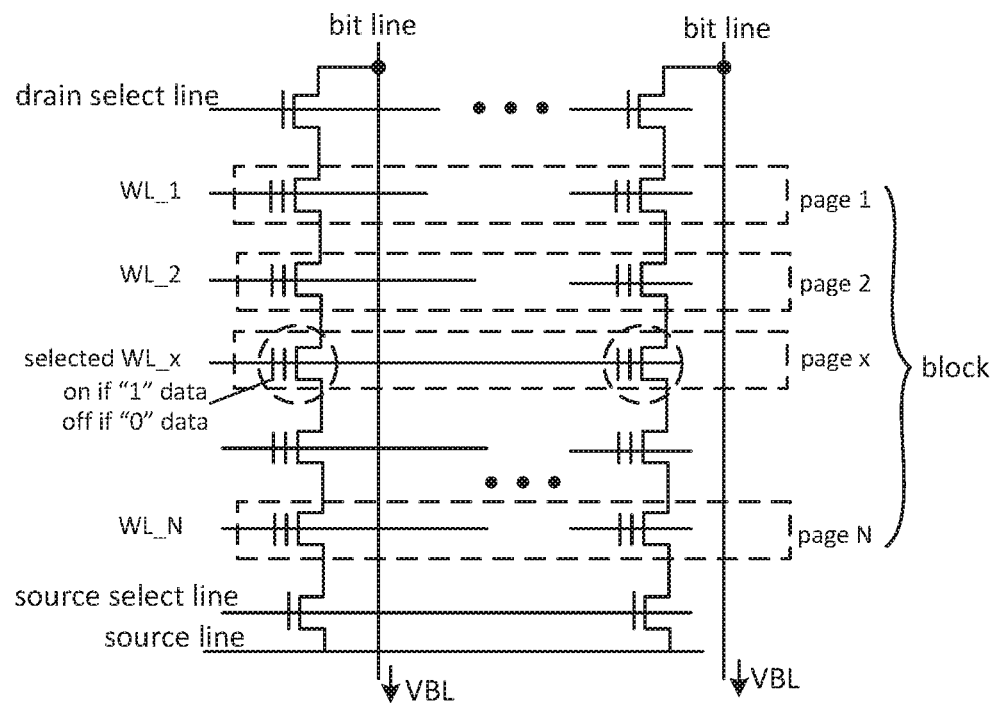
FIG. 3B is a schematic diagram illustrating a portion of the flash memory according to embodiments of the present disclosure.

FIG. 3B illustrates a selected page of a block 30B of the memory cell according to an embodiment of the present invention. As shown, block 30B includes a number N of pages. All unselected pages are "on" ("1"). Transistors of the selected page are "on" when they have "1" data and "off" when they have "0" data stored in their floating gate. For reading data from a selected memory cell, the bit line associated with the memory cell string of the selected memory cell is precharged, when the selected memory cell has "0" data, the transistor is turned off, so that there is no current flowing from the bit line to the source line. When the selected memory cell has "1" data, the transistor is turned on, so that a current flows from the bit line to the common source line, thereby discharging the bit line.

Figure 3C:
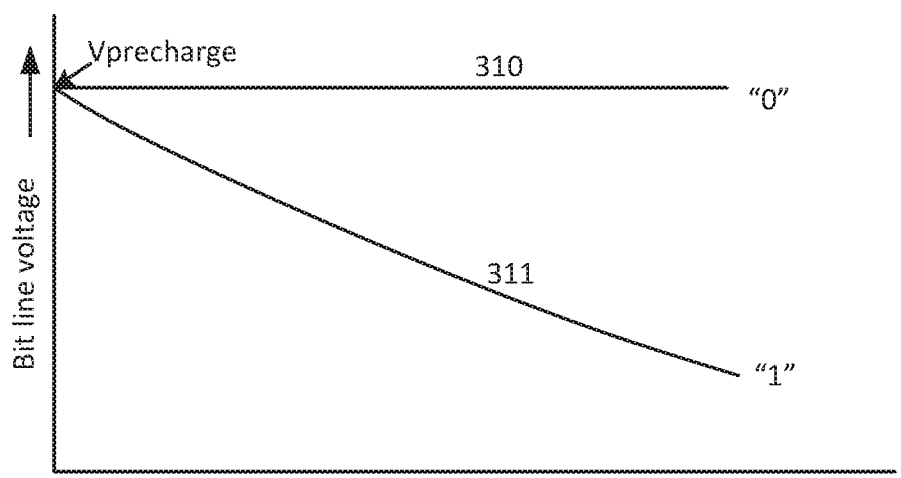
FIG. 3C is a graph illustrating the voltage on a bit line of a selected cell when data is "0" and "1" according to an example embodiment of the present invention.

FIG. 3C is a graph of a voltage on the bit line of a selected memory cell when data is "0" and "1" according to an embodiment of the present invention. When reading the selected page, the bit lines are precharged to a certain voltage level denoted "Vprecharge," as shown in FIG. 3C. When "0" data is stored in the selected memory cell, the transistor is "off", so that there is no current flow from the bit line to the common source line, and there is no significant voltage change (except some leakage) on the bit line (denoted "310"). When "1" data is stored in the selected memory cell, the transistor is "on", a path is formed from the bit line to the common source line (e.g., ground potential), so that a current flows from the bit line to the common source line causing a voltage change in the bit line (denoted "311"). In an embodiment of the present invention, the voltage change or the current change of all bit lines (e.g., the selected page) is summed in an accumulator. The summed voltages or currents (or the sum of voltage and current changes) are amounted to a voltage level or current level that is then compared with a predetermined threshold voltage or current value to determine whether or not the selected page is an erased page. In other words, if the selected page contains all "0" data, the summed voltage level is higher than the summed voltage level if the selected page contains all "1" data (i.e., an erased page) because there is no voltage discharge in the bit line (the transistor is turned off). Conversely, the summed current level of an erased page (all "1" data) is higher than the summed current level of a written page because there is a current flowing through the bit line (the transistor is turned on).

Figure 4A:
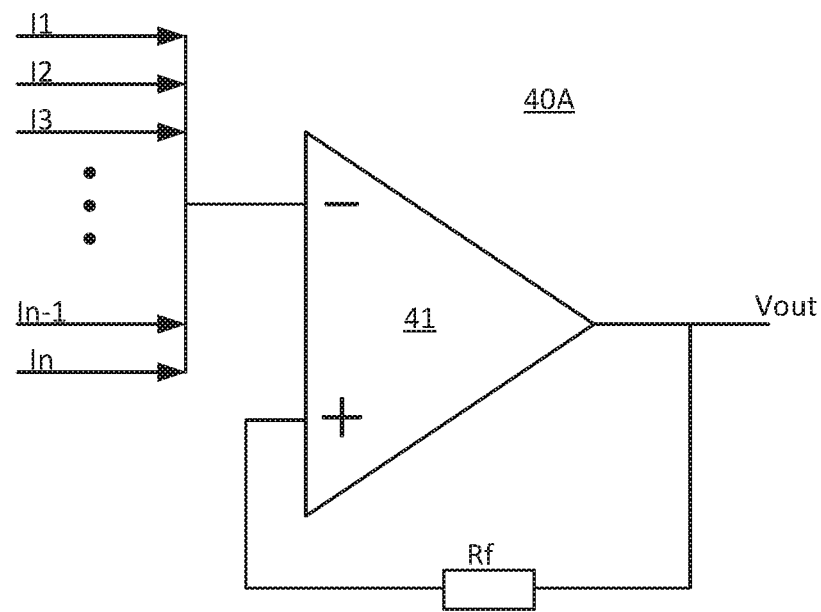
FIG. 4A is a schematic block diagram of an accumulator for summing currents of a selected page according to some embodiments of the present disclosure.

FIG. 4A is an exemplary current accumulator (a current summing circuit) 40A according to an embodiment of the present invention. Current accumulator 40 includes an operational amplifier 41 having a negative input terminal, a positive input terminal, and an output terminal coupled to the positive input terminal through a feedback resistor Rf. Currents I1, I2, . . . , In–1 of corresponding bit lines of a selected page are coupled to the negative input terminal of the operational amplifier. As is well known, the output Vout of current accumulator 40A with a feedback operational amplifier is obtained by applying Kirchhoff's first law to the input terminal of the operational amplifier according to the following relation:

$$Vout=-Rf(I1+I2+\ldots+In)$$

where I1, I2, . . . , In are currents of corresponding bit lines of a selected page.

Figure 4B:
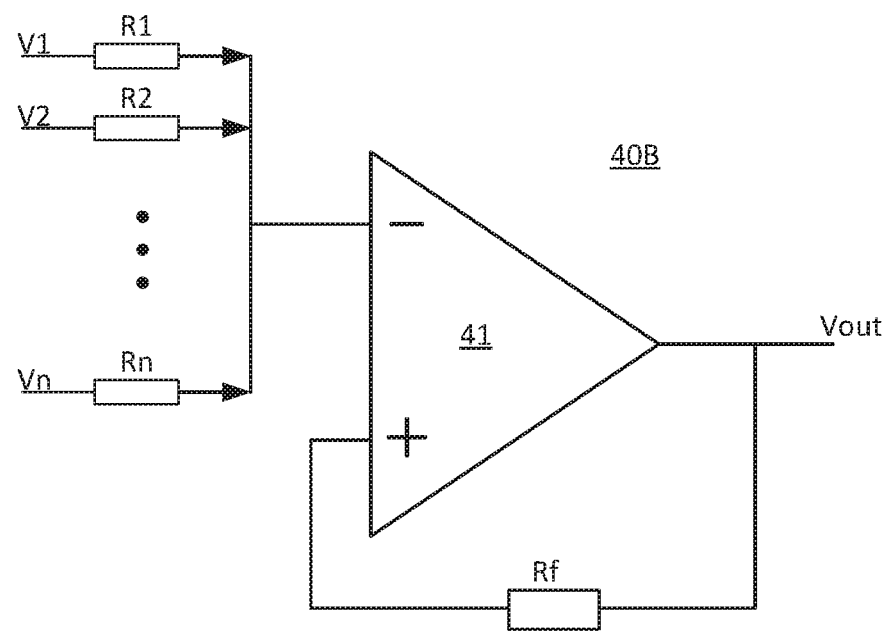
FIG. 4B is a schematic block diagram of an accumulator for summing voltages of a selected page according to some embodiments of the present disclosure.

FIG. 4B is an exemplary voltage accumulator (a voltage summing circuit) 40B according to an embodiment of the present invention. Voltage accumulator 40B is similar to current accumulator 40A of FIG. 4A with the difference that a resistor is connected between the voltage of the bit line and the input terminal of the operational amplifier 51. Similar to the current accumulator, the output Vout of voltage accumulator 40B with a feedback operational amplifier is obtained by applying Kirchhoff's first law to the input terminal of the operational amplifier according to the following relation:

$$Vout=-Rf(V1/R1+V2/R2+\ldots+Vn/Rn)$$

where V1, V2, . . . , Vn are voltages of corresponding bit lines of a selected page, R1, R2, . . . , Rn are the corresponding resistors disposed between the bit line voltages and the negative input terminal of the operational amplifier. In an embodiment, R1, R2, . . . , and Rn have the same value R, so that the output voltage of the voltage accumulator satisfies the following relation:

$$Vout=-Rf/R(V1+V2+\ldots+Vn)$$

In an embodiment, the flash memory device determines whether or not a selected page is an erased page by comparing the output voltage of the accumulator to a predetermined threshold voltage. Since the output voltage of the accumulator has the maximum value (or the minimum value) when the selected page is an erased page. By comparing the output voltage Vout of the accumulator with a predetermined voltage value, the flash memory device may determine the state of the selected page.

Figure 5:
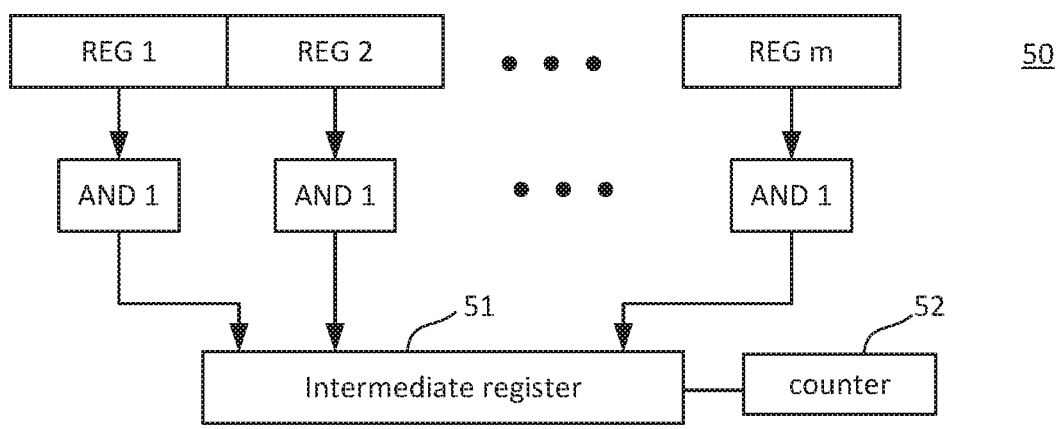
FIG. 5 is a schematic block diagram of a digital accumulator according to an embodiment of the present invention.

FIG. 5 is block circuit diagram of a digital accumulator 50 according to an embodiment of the present invention. Accumulator 50 may include a plurality of registers, e.g., reg1, reg2, . . . , regm, where m is an integer and digital logic (e.g., NAND, NOR, XOR, etc. The registers reg1, reg2, regm may be registers having 32-bit, 63-bit, 128-bit and so on. In an embodiment, the total number of bits in the registers reg1, reg2, regm may correspond to the number of bits of register 108 (FIG. 1). Each of the registers reg1, reg2, regm may be connected to a logic gate AND-m having a number "m" of inputs corresponding to the number of bits of each of the registers reg1, reg2, . . . , regm. When all bits of a register are ones, the output of the AND gate is "1", otherwise the output of the AND gate is "0". The output states of the AND gates are stored in an intermediate register. The number of "1s" stored in the intermediate register can be determined using a binary counter (e.g., counter 52) or by software executed by control circuit 120. In another embodiment, each of the registers reg1, reg2, . . . , regm may be connected to a logic gate OR-m (not shown) having a number "m" of inputs corresponding to the number of bits of each of the registers. When all bits of a register are zeroes, the output of the OR gate is "0", otherwise the output of the OR gate is "1". The output states of the OR gates are stored in the intermediate register reg1, reg2, . . . , regm. The number of "0s" stored in the intermediate register can be determined using a binary counter or by software executed by control circuit 120. The use of digital accumulator 50 provides the advantage for a fast determination whether there is a sufficient number of 1s or 0xFF patterns in readout data a selected page without relaying on counting them directly from register 108 to save clock cycles. In other words, counter 52 can have fewer counting stages than counter 130. In certain embodiments, counter 130 may be used as counter 52 to determined the number of 1s or 0xFF patterns in intermediate register 51.

In an embodiment of the present invention, the determination whether a selected page is an erased page is performed by a comparator.

Figure 6A:
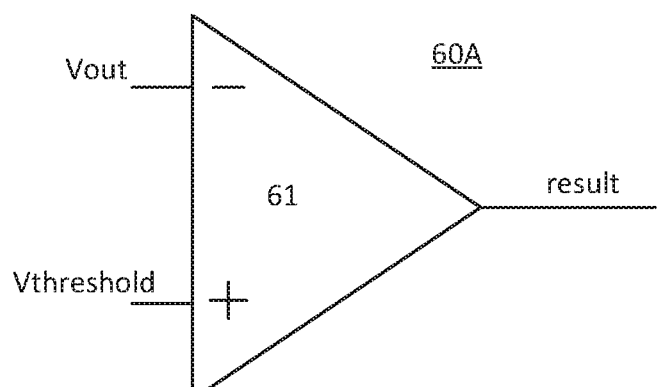
FIG. 6A is a schematic block diagram of an analog comparator for comparing two voltages according to an embodiment of the present invention.

FIG. 6A illustrates an analog comparator circuit 60A according to an embodiment of the present invention. Comparator circuit 60A includes an operational amplifier 61 having a positive input terminal, a negative input terminal and an output terminal. The output voltage Vout of the accumulator (40, 50) may be connected to one of the input terminal and the predetermined voltage may be connected to another input terminal. The voltage state at the output terminal of comparator circuit 60A indicates the comparison result. In an embodiment, the comparison result is stored in status register 122 prior to outputting through I/O port 114 to external controller 20. In an embodiment, the comparison result may be represented by a 1-bit of the status register, shown as status bit 124 in FIG. 1.

Figure 6B:
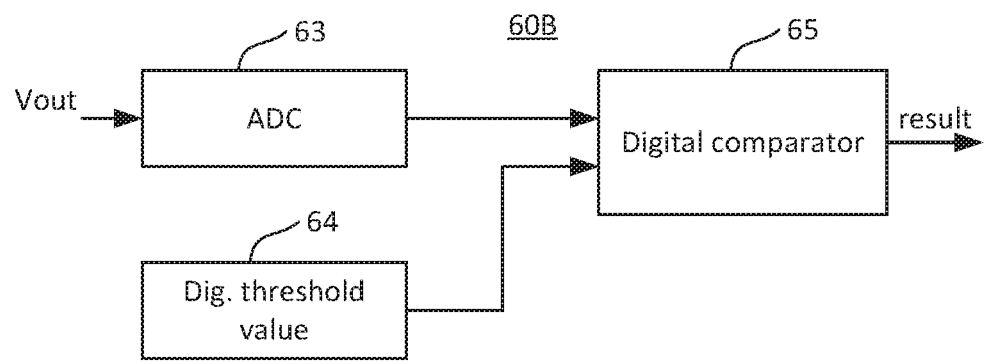
FIG. 6B is a schematic block diagram of a digital comparator for comparing two voltages according to an embodiment of the present invention.

FIG. 6B is a schematic block diagram of a digital comparator 60B for comparing two digital values according to an embodiment of the present invention. Digital comparator 60B may include an analog-digital converter (ADC) 63, a register 64, and a digital comparator 65. ADC 63 converts the analog output signal Vout received from the accumulator (40, 50) to a digital representation having n bits. Register 64 contains a digital representation of the threshold voltage in n bits resolution. Digital comparator 65 compares these two digital values with each other based on software program executed by control circuit 120. The comparison result may be stored in a status register. In an embodiment, the digital comparison result may be represented by a 1-bit of the status register 122, e.g., status bit 124 in FIG. 1.

In some embodiments, the digital value of the counter 52 can be directly compared with the digital threshold value stored in register 64 by digital comparator 65, bypassing the ADC 63 in FIG. 6B.

In some embodiments, control circuit 130 may execute instructions stored in a memory (e.g., memory 140) to determine the state of a selected page by counting the number of 1s in register 108 and comparing the counted number of 1s with a predetermined value. In such example embodiments, dedicated accumulator and comparator can be omitted in flash memory 10.

Figure 7:
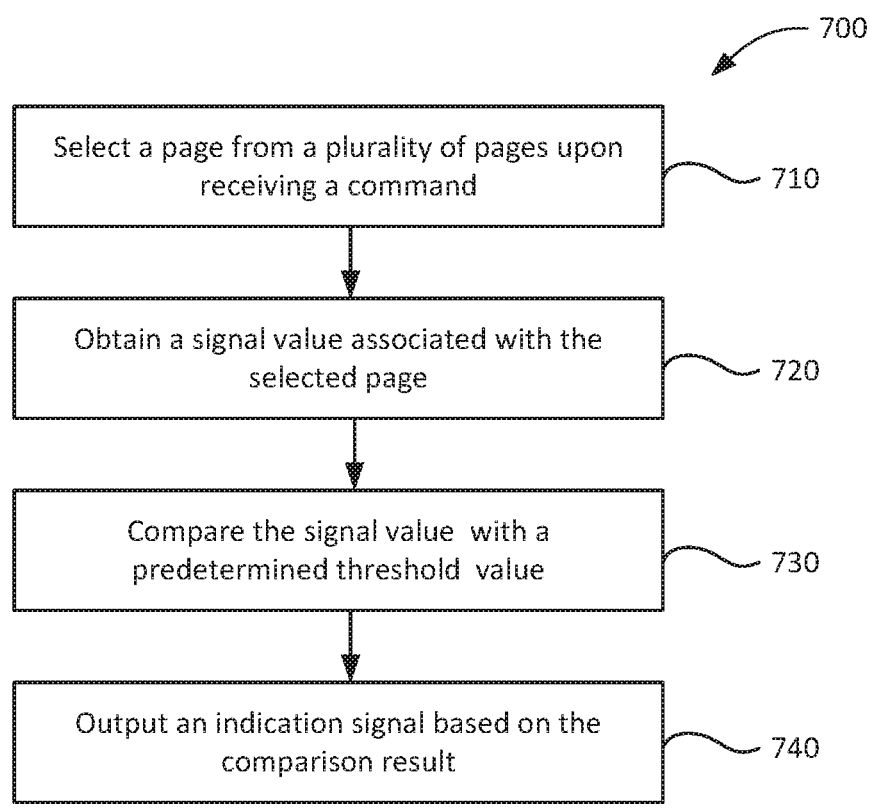
FIG. 7 is a flowchart of a method of determining a status of a page in a flash memory device according to an embodiment of the present invention.

FIG. 7 illustrates a method 700 of determining a state of a page in a flash memory including a plurality of pages and a control circuit. Each page may include a plurality of cell strings. Each cell string is connected to a bit line and includes a plurality of series-connected memory cells. The control circuit may include one or more processing units and a memory 140 (e.g., SRAM, ROM, flash, and the like) for storing instructions executable by the one or more processing units. Method 700 may include selecting, by the control circuit, a page from the plurality of pages upon receiving a command from a controller (710), obtaining a signal value associated with the selected page (720), comparing the signal value with a predetermined threshold value (730), and outputting an indication signal indicative of the state of the selected memory page based on a comparison result (740).

In step 710, the flash memory (e.g., flash memory 10 in FIG. 1) receives a special command and the page address from a controller (e.g., controller 20) that can be an integral part of the flash memory or external to the flash memory. The special command may be a command requesting the state (erased or programmed state) of the selected page.

In step 720, the control circuit decodes the special command and generates the necessary voltages to the selected page. In some embodiment, the signal value can be obtained by summing signal (voltage or current) changes on bit lines associated with the selected page by an accumulator (e.g., accumulator 116). In other embodiment, the signal value can be obtained by determining the number of 1s or 0xFF patterns by the control circuit executing specific instructions stored in a memory (SRAM, ROM, flash, EPROM, EEPROM, MROM, etc.).

In step 730, the signal value is compared with a predetermined threshold value by the comparator, which outputs a comparison result. In some embodiment, the signal value may be an analog value and the comparison is performed by an analog comparator. In some other embodiments, the signal value may be a digital value, and the comparison may be executed by the control circuit executing specific instructions stored in a memory.

In step 740, the control circuit outputs an indication signal based on the comparison result. The indication signal may be a 1-bit signal stored in a status register (e.g., status register 122) indicating the state of the selected page. The indication signal will be transmitted to the controller (e.g. controller 20) through the I/O port of the flash memory.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A flash memory device comprising:
   a flash memory comprising a plurality of pages, each page of the plurality of pages configured to store data;
   a control circuit configured to select a page of the plurality of pages in response to a received command;
   a first operational amplifier configured to obtain a sum of voltage changes on bit lines associated with the selected page of the plurality of pages;
   a comparator configured to compare the sum of voltage changes with a predetermined value,
   wherein the control circuit generates an indication signal indicative of a state of the selected page based on a comparison result.

2. The flash memory device of claim 1, wherein the comparator comprises a second operational amplifier having a first input terminal for receiving the sum of voltage changes and a second terminal for receiving the predetermined value and an output terminal for outputting the comparison result in response to the sum of voltage changes and the predetermined value.

3. The flash memory device of claim 1, wherein the comparator comprises:
   an analog-digital converter configured to convert the sum of voltage changes to a digital representation;
   a register configured to store the predetermined value;
   wherein the comparator compares the digital representation with the predetermined value under control of the control circuit and outputs the comparison result.

4. The flash memory device of claim 1, wherein the indication signal is a one-bit signal.

5. The flash memory device of claim 1, wherein the flash memory comprises a NAND flash memory.

6. The flash memory device of claim 1, further comprising an input/output interface configured to provide the indication signal to an external flash memory controller.

7. A flash memory device comprising:
   a flash memory comprising a plurality of pages, each page of the plurality of pages configured to store data;
   a data register coupled to the flash memory and configured to latch data associated with a selected page of the plurality of pages;
   an accumulator configured to obtain a value associated with a number of 1s or a number of 0xFF patterns of the selected page;
   an input/output (I/O) interface configured to receive a command from a controller; and
   a control circuit configured to:
      compare the value with a predetermined value to obtain a comparison result, and
      generate an indication signal indicative of a state of the selected page based on the comparison result,
   wherein the accumulator comprises:
   an intermediate register configured to store a compressed number of 1s associated with the number of 1s or the number of 0xFF patterns; and
   a counter configured to count the compressed number of 1s to obtain the value.

8. The flash memory device of claim 7, further comprising a decoder configured to decode the received command, wherein the received command is associated with an operation to determine the state of the selected page and output the determined state of the selected page to the controller.

9. The flash memory device of claim 7, wherein the indication signal is provided to the controller via the I/O interface.

10. The flash memory device of claim 7, wherein the controller is external to the flash memory.

11. The flash memory device of claim 7, wherein the flash memory comprises a NAND flash memory.

12. A method of determining a state of a page in a flash memory comprising a plurality of pages and a control circuit, the method comprising:
   selecting a page from the plurality of pages based on a command received from a controller coupled to the flash memory;
   obtaining, by an accumulator, a value associated with a number of 1s or a number of 0xFF patterns of the selected page in response to the received command;
   compressing the number of 1s or the number of 0xFF patterns to obtain a compressed number of 1s;
   storing the compressed number of 1s in an intermediate register; and
   counting the compressed number of 1s to obtain the value;
   comparing the value with a threshold value; and
   outputting an indication signal indicative of the state of the selected page based on a comparison result.

13. The method of claim 12, wherein the indication signal is a one-bit signal.

14. The method of claim 12, further comprising, upon determining that the value associated with the number of 1s or the number of 0xFF patterns is greater than the threshold value, determining that the selected page is an erased page, otherwise determining that the selected page is a programmed page.

15. The method of claim 14, further comprising:
   storing an address associated with the erased page; and
   transmitting the address to the controller.

16. The method of claim 12, wherein the controller is external to the flash memory.

* * * * *